(12) United States Patent
Behler et al.

(10) Patent No.: US 6,435,492 B1
(45) Date of Patent: Aug. 20, 2002

(54) DIE BONDER AND/OR WIRE BONDER WITH A SUCTION DEVICE FOR PULLING FLAT AND HOLDING DOWN A CURVED SUBSTRATE

(75) Inventors: Stefan Behler, Steinhausen; Reto Schubiger, Ebikon; Beat Zumbuehl, Rotkreuz, all of (CH)

(73) Assignee: ESEC Trading SA, Cham (CH)

(*) Notice: Subject to any disclaimer, the term of this patent is extended or adjusted under 35 U.S.C. 154(b) by 0 days.

(21) Appl. No.: 09/732,678

(22) Filed: Dec. 8, 2000

(30) Foreign Application Priority Data

Dec. 14, 1999 (CH) .............................................. 2290/99

(51) Int. Cl.[7] .............................................. B25B 11/00
(52) U.S. Cl. .............................. 269/21; 451/388; 29/569
(58) Field of Search ........................ 269/21, 329; 279/3, 279/139, 156; 451/289, 388; 198/345.1; 219/243, 526; 156/583.1

(56) References Cited

U.S. PATENT DOCUMENTS

| | | | |
|---|---|---|---|
| 3,934,916 A | * 1/1976 | Baker | 294/64 R |
| 4,566,170 A | 1/1986 | Dolan | 29/569 |
| 5,281,794 A | 1/1994 | Uehara et al. | |
| 5,452,905 A | 9/1995 | Bohmer et al. | |
| 5,707,051 A | 1/1998 | Tsuii | |
| 5,839,877 A | 11/1998 | Kikuchi | 414/797 |
| 5,923,408 A | 7/1999 | Takabavashi | |
| 5,937,993 A | 8/1999 | Sheets et al. | |
| 6,164,633 A | * 12/2000 | Mulligan | 269/21 |

FOREIGN PATENT DOCUMENTS

| | | | | |
|---|---|---|---|---|
| DE | 2301187 | * | 7/1973 | 451/388 |
| DE | 41 29 146 C2 | | 7/1993 | |
| EP | 0 298 564 A1 | | 1/1989 | |
| EP | 0 456 426 A1 | | 11/1991 | |
| EP | 0 565 278 A1 | | 10/1993 | |
| GB | 2 120 141 A | | 11/1983 | |
| JP | 319965 | * | 12/1989 | 269/21 |
| JP | 02105429 A | | 4/1990 | |
| JP | 06069254 A | | 3/1994 | |
| JP | 406155211 | * | 6/1994 | 269/21 |

* cited by examiner

*Primary Examiner*—Joseph J. Hall, III
*Assistant Examiner*—Daniel Shanley
(74) *Attorney, Agent, or Firm*—McCormick, Paulding & Huber LLP

(57) ABSTRACT

A Die Bonder or Wire Bonder has a suction device for pulling flat and holding down a curved substrate equipped with or to be equipped with a semiconductor chip onto a supporting surface of a plate. The plate contains at least one cavity open towards the supporting surface in which there is a vacuum gripper made out of flexible material, whereby the vacuum gripper is lowerable into the cavity during transport of the substrate and which is raisable above the level of the supporting surface to apply suction to the substrate.

4 Claims, 1 Drawing Sheet

Figure 1A:
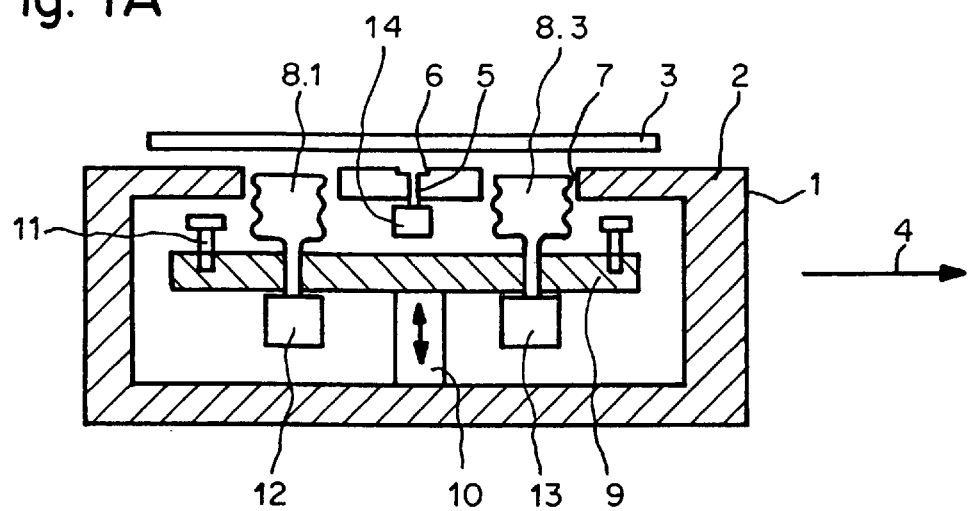

DIE BONDER AND/OR WIRE BONDER WITH A SUCTION DEVICE FOR PULLING FLAT AND HOLDING DOWN A CURVED SUBSTRATE

BACKGROUND OF THE INVENTION

The invention concerns a Die Bonder and/or Wire Bonder with a suction device for pulling flat and holding down a curved substrate.

When mounting semiconductor chips on a substrate by means of a so-called Die Bonder, the substrate is transported on a supporting surface in steps of a predetermined distance so that a semiconductor chip can be mounted at the foreseen location. In order that the substrate lies flat on the supporting surface, the supporting surface has a drill hole connectable to a vacuum source for the suction and holding down of the substrate.

Some substrates, for example BGA®s (Ball Grid Array) which are already equipped with semiconductor chips and which are first to be coated with adhesive and then equipped with a second semiconductor chip or those which are fed to the bonding station of a Wire Bonder for the making of wire connections, can, under certain circumstances, be curved to such an extent that suction of the substrate is unsuccessful.

The object of the invention is to specify a suction device which can hold down even strongly curved substrates level with the supporting surface.

BRIEF DESCRIPTION OF THE INVENTION

The invention consists in that cavities are foreseen in the supporting surface with raisable and lowerable vacuum grippers made of flexible and in shape stable material. With a Die Bonder, the substrate is always advanced in steps to the dispensing station where adhesive is applied and then to the bonding station where the next semiconductor chip is mounted. With a Wire Bonder, the substrate is always advanced in steps to the bonding station where the wires are attached between the semiconductor chip and the substrate. During the forward feed of the curved substrate the vacuum grippers are lowered into the cavities. As soon as the substrate has reached its position, the vacuum grippers are raised by a predetermined distance by means of a lifting cylinder and vacuum is applied. In this position, the vacuum grippers protrude beyond the level of the supporting surface. As soon as the vacuum gripper touches the underneath of the curved substrate, a more or less well-sealed cavity is created. The pressure difference between the pressure on the upper surface of the substrate (atmospheric pressure) and the pressure in the cavity on the underneath (vacuum) then has the effect that the substrate is pressed flat against the supporting surface whereby the flexible vacuum gripper is compressed. As soon as the process—application of adhesive or mounting of semiconductor chip or wiring—is completed, the vacuum is released and the lifting cylinder is lowered. The solution in accordance with the invention has the advantage that, during forward feed of the substrate, the vacuum grippers are located lowered below the supporting surface and therefore can not interfere with the forward feed of the substrate.

In the following, an embodiment of the invention is described in more detail based on the drawing which is not to scale.

BRIEF DESCRIPTION OF THE DRAWING FIGURES

Figure 2:
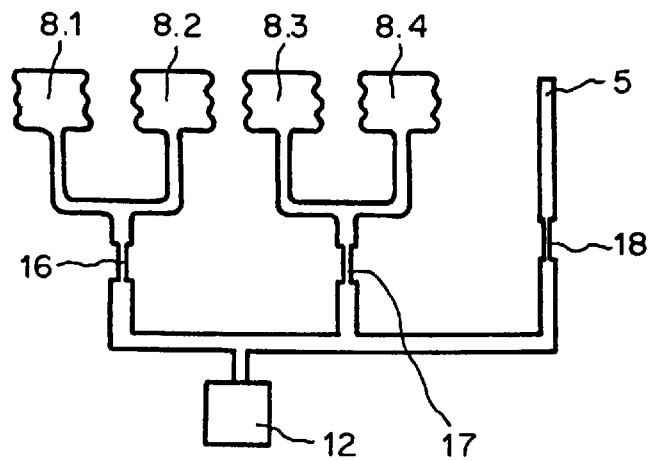

It is shown in:

FIGS. 1A, B a cross-section and a plan view of a suction device for receiving a substrate, and FIG. 2 a further suction device.

DETAILED DESCRIPTION OF THE INVENTION

Figure 1B:
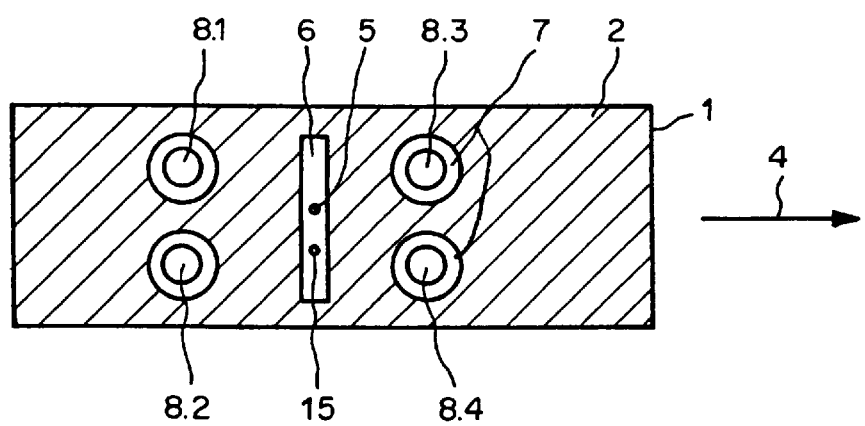

FIGS. 1A and 1B show a cross-section and a plan view of a suction device with a plate 1 having a level supporting surface 2 for receiving a substrate 3. The substrate 3 is fed forwards in steps by a not presented transport arrangement in a transport direction 4 to a processing station where adhesive is applied or where it is equipped with a semiconductor chip or where wire connections are made between a mounted semiconductor chip and the substrate 3. The plate 1 has a drill hole 5 connectable to a vacuum source which can be switched on and off and a groove 6 let into the supporting surface 2. The groove 6 is located at the position of the processing station. The plate 1 contains four cavities 7 arranged in a matrix shape which are open towards the supporting surface 2 in each of which a lowered flexible vacuum gripper 8.1 to 8.4 is arranged. The vacuum grippers 8.1 to 8.4 are preferably so-called bellow-type vacuum grippers which, thanks to the folds, can be compressed in their longitudinal direction. The four vacuum grippers 8.1 to 8.4 are mounted on a carrier plate 9 which is moved up and down between an upper travel limit and a lower travel limit by means of a pneumatically driven lifting cylinder 10. The lower travel limit and the upper travel limit are defined by means of stops. The upper travel limit is defined, for example, by means of screws 11 arranged in the carrier plate 9 the heads of which, on raising the lifting cylinder 10, strike on the plate 1. By means of the screws 11 it can be precisely defined by which distance D the vacuum grippers 8.1 to 8.4 protrude above the level of the supporting surface 2 at the upper travel limit. At the upper travel limit, the vacuum grippers 8.1 to 8.4 protrude above the level of the supporting surface 2 by a distance D of typically around 2 mm. The distance D is dependent on the maximum curvature of the substrate 3. At the lower travel limit, the vacuum grippers 8.1 to 8.4 are located completely lowered within the respective cavity 7 so that the forward feed of the substrate 3 can take place unhindered.

On the one hand, with increasing diameter of the suction opening of the bellow-type vacuum gripper, the force acting upon the substrate 3 increases when vacuum is applied while, on the other hand, the rigidity of the bellow-type vacuum gripper increases which offers mechanical resistance to the suction of the substrate 3. Bellow-type vacuum grippers of type FG 9 from the company Schmalz have proved to be reliable.

The two vacuum grippers 8.1 and 8.2 which are arranged at the same level when viewed in transport directiong 4 are connected to a not presented vacuum source by means of a first valve 12. The two vacuum grippers 8.3 and 8.4 which are also arranged at the same level when viewed in transport direction 4 are connected to the vacuum source by means of a second valve 13. The drill hole 5 is connected to the vacuum source by means of a third valve 14.

In operation, the suction device works correspondingly to the working cycle of the machine as follows: The lifting cylinder 10 is first located at its lower travel limit: the vacuum grippers 8.1 to 8.4 are located lowered into the cavities 7. The valves 12, 13 and 14 are closed: No vacuum is applied to the drill hole 5 or to the vacuum grippers 8.1 to 8.4. The substrate 3 is fed forward. After the substrate 3 has reached its foreseen position, the lifting cylinder 10 is brought to its upper travel limit. Furthermore, the three valves 12, 13 and 14 are opened so that vacuum is applied to the drill hole 5 and the vacuum grippers 8.1 to 8.4. As soon as a vacuum gripper touches the underneath of the substrate 3, a more or less well-sealed cavity is created. The pressure difference between the pressure on the upper surface of the substrate 3 (atmospheric pressure) and the pressure in the cavity underneath (vacuum) then has the effect that the substrate 3 is pressed flat against the supporting surface 2 whereby the vacuum gripper is compressed. As soon as the substrate 3 lies flat on the supporting surface 2, the cavity formed between the groove 6 and the substrate 3 is also filled with vacuum. Because of the groove 6, the substrate 3 is on the one hand sucked onto the processing location and, on the other hand, is supported on the area of the supporting surface 2 surrounding the groove 6. As soon as the process—application of adhesive or mounting or wiring the semiconductor chip—is completed, the three valves 12, 13 and 14 are closed and the lifting cylinder 10 is lowered. The working cycle is completed and the next working cycle begins.

In operation, it often occurs that only the two vacuum grippers 8.1 and 8.2 or only the two vacuum grippers 8.3 and 8.4 are covered by the substrate 3. Nevertheless, sufficient vacuum can be built up between the substrate 3 and the covered vacuum grippers to press the substrate 3 flat when the internal flow resistance of the valves 12, 13 and 14 is large enough. The vacuum grippers which are not covered then create a leak, but the throughput of the incoming air remains low enough and cannot decay the vacuum.

The three valves 12, 13 and 14 are preferably switched on and off simultaneously. However, it is also possible to open valve 14 which applies vacuum to the drill hole 5 with a slight delay.

Optionally, there can be a second drill hole 15 opening into the groove 6 at the other end of which a not presented sensor is arranged for measuring the vacuum. After each opening of the three valves 12, 13 and 14, the sensor checks whether or not the vacuum in the drill hole 15 or in the groove 6 reaches a predetermined value. If the substrate 3 lies flat on the supporting surface 2, the vacuum in the drill hole 15 or in the groove 6 beneath the substrate develops, the sensor responds and the process step is carried out. If the desired vacuum strength is not achieved, then an error message is produced.

FIG. 2 shows a schematic drawing of a further suction device with which the four vacuum grippers 8.1 to 8.4 and the drill hole 5 are connected to one single valve 12. The two vacuum grippers 8.1 and 8.2 which are arranged next to each other when viewed in transport direction 4 are connected to the valve 12 via a common flow resistance 16. The two vacuum grippers 8.3 and 8.4 which are also arranged next to each other when viewed in transport direction 4 are connected to the valve 12 via a common flow resistance 17. The drill hole 5 is connected to the valve 12 via a third flow resistance 18. The task of the flow resistors 16 to 18 is to limit the leakage rate when the corresponding vacuum grippers or the drill hole 5 are not covered so that the other covered vacuum grippers can nevertheless apply suction to the substrate 3. Such a flow resistance consists, for example, of a throat installed in the line between the vacuum gripper and the valve, the cross-section and length of which result in the desired flow resistance.

The design of the suction device with four vacuum grippers guarantees perfect holding of the substrate with optimum utilization of the available area and optimum adaptation to the manner in which the substrates are transported: It must namely be taken into consideration that the substrates have to be fed one after the other to the processing station and must be held there flat on the supporting surface. Instead of the circular bellow-type vacuum gripper, vacuum grippers of a different shape, e.g., of a rectangular, square or eliptical shape, can also be used.

What is claimed is:

1. Die Bonder or Wire Bonder with a suction device to pull flat and hold down a curved substrate at a processing station, the suction device comprising a plate with a supporting surface for the substrate, the plate containing at least one cavity open towards the supporting surface;

a vacuum gripper made out of flexible material located in the at least one cavity;

a drive mechanism for raising the vacuum gripper above the level of the supporting surface to apply suction to the substrate and for lowering the vacuum gripper into the cavity during transport of the substrate; and a sensor for measuring the vacuum beneath the substrate at the processing station.

2. Die Bonder or Wire Bonder according to claim 1, the vacuum gripper being of the bellow-type.

3. Die Bonder or Wire Bonder according to claim 1, wherein the supporting surface comprises a groove located at a position of the processing station and a bore for applying vacuum to the groove and wherein at least one of said cavities is located on a first side of the groove and at least one of said cavities is located on an opposite side of the groove when seen in a direction of transport of the substrate.

4. Die Bonder or Wire Bonder according to claim 2, wherein the supporting surface comprises a groove located at a position of the processing station and a bore for applying vacuum to the groove and wherein at least one of said cavities is located on a first side of the groove and at least one of said cavities is located on an opposite side of the groove when seen in a direction of transport of the substrate.

* * * * *